(12) United States Patent
Elliott et al.

(10) Patent No.: US 7,652,611 B2
(45) Date of Patent: Jan. 26, 2010

(54) FRONT-END SAMPLING TECHNIQUE FOR ANALOG-TO-DIGITAL CONVERTERS

(75) Inventors: Michael Elliott, Summerfield, NC (US); Frank Murden, Roan Mountain, TN (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/123,908

(22) Filed: May 20, 2008

(65) Prior Publication Data

US 2009/0289827 A1   Nov. 26, 2009

(51) Int. Cl.
*H03M 1/38* (2006.01)
(52) U.S. Cl. .................. 341/161; 341/162; 341/172
(58) Field of Classification Search .......... 341/161, 341/162, 172
See application file for complete search history.

(56) References Cited

U.S. PATENT DOCUMENTS

| | | | |
|---|---|---|---|
| 6,396,429 B2 * | 5/2002 | Singer et al. ............. | 341/155 |
| 6,882,292 B1 | 4/2005 | Bardsley et al. | |
| 7,339,512 B2 * | 3/2008 | Gulati et al. ............. | 341/172 |
| 2004/0051657 A1 | 3/2004 | Jonsson et al. | |
| 2006/0284678 A1 | 12/2006 | Dillon | |

OTHER PUBLICATIONS

Jun. 24, 2009 International Search Report for PCT/US09/43411.

* cited by examiner

*Primary Examiner*—Khai M Nguyen
(74) *Attorney, Agent, or Firm*—Kenyon & Kenyon LLP (57) ABSTRACT

Embodiments of the present invention provide a pipeline ADC front-end sampling structure that provides a continuous time input signal to a flash comparator for sampling. By providing a continuous time input signal to the flash comparator, no delay is introduced from the need to transfer a DC charge representing the sampled input to the flash comparator. Matching sampling networks in the residual generator and the flash comparator are avoided due to the high bandwidth response requirements of the residual generator and the flash comparator when operating on high frequency input signals.

19 Claims, 6 Drawing Sheets

FRONT-END SAMPLING TECHNIQUE FOR ANALOG-TO-DIGITAL CONVERTERS

BACKGROUND OF THE INVENTION

1. Field of the Invention

The present invention generally relates to analog-to-digital converters (ADCs). More specifically, the present invention provides an improved front-end ADC pipeline sampling technique to accommodate high frequency analog input signals.

2. Background Art

Pipeline ADCs are often used to generate multiple bit digital representations of analog signals. Each stage of a pipeline ADC resolves a few bits of the overall multiple bit digital representation. By combining the outputs of each stage of the pipeline ADC, a high resolution, multiple bit representation is formed.

Pipeline ADC stages generally include a flash comparator and a residual generator. The flash comparator generates the output bits for the ADC stage. The residual generator generates an error signal that is passed to the next ADC stage to further refine the representation of the analog input signal.

To ensure proper operation of the ADC stage, the flash comparator and residual generator should operate on substantially the same sample of the analog input signal. To meet this requirement, many conventional ADC stage designs use a front-end sample-and-hold (S/H) circuit. Other conventional ADC stage designs require the sampling networks of the residual generator and flash comparator to be precisely matched. Both prior art designs can suffer from a number of drawbacks including high noise introduction and high power requirements or they can strain the operational capabilities of the residual generator. Overall, both designs may limit the frequency range of the analog input signal that can be received and processed by the ADC stage.

Accordingly, there is a need for an ADC stage and sampling technique that obviates the need for a front-end S/H circuit while still supporting high frequency analog input signals.

BRIEF DESCRIPTION OF THE DRAWINGS

The accompanying drawings illustrate the present invention and, together with the description, further serve to explain the principles of the invention and to enable one skilled in the pertinent art to make and use the invention.

DETAILED DESCRIPTION OF THE INVENTION

Embodiments of the present invention provide a pipeline ADC front-end sampling structure that provides a continuous time input signal to a flash comparator for sampling. By providing a continuous time input signal to the flash comparator, no delay is introduced from the need to transfer a DC charge representing the sampled input to the flash comparator. Matching sampling networks in a residual generator and the flash comparator are avoided due to the high bandwidth response requirements of the residual generator and the flash comparator when operating on high frequency input signals.

In an initial phase, input capacitors of parallel comparators are pre-charged to appropriate reference voltages. In an acquisition phase, the analog input signal is directly applied to the pre-charged capacitors. The analog input signal, offset by the reference voltage for a particular comparator, is then provided to and sampled at the regeneration nodes of the of the comparator. Propagation of the offset analog input signal to the comparator is much faster than the time needed to transfer a DC charge representing a sampled input signal as required by prior art designs. Consequently, the improved S/H-less architecture can accommodate increased sampling rates and therefore higher bandwidth input signals.

Figure 1:
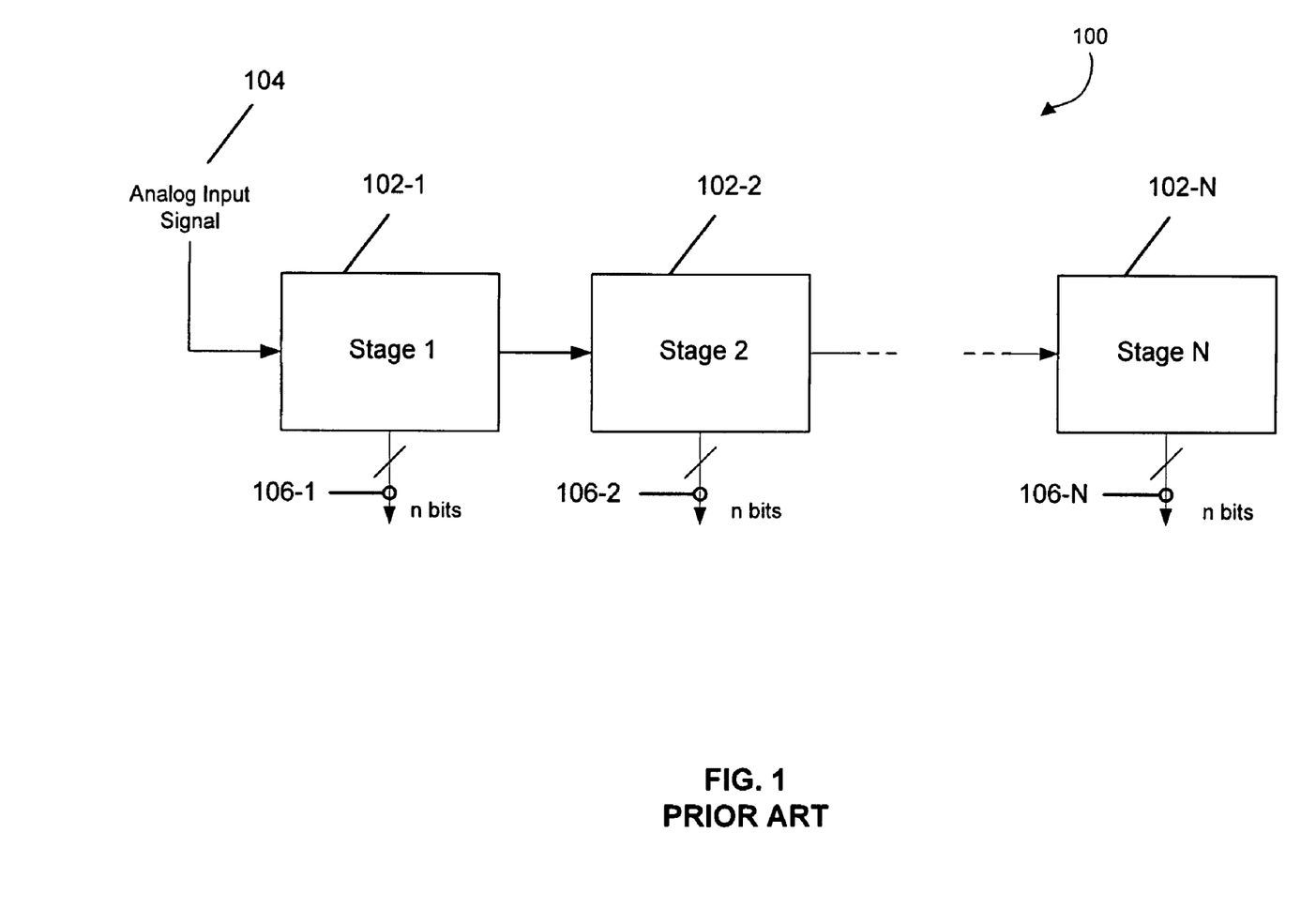
FIG. 1 is a simplified block diagram of a pipeline analog-to-digital converter (ADC).

FIG. 1 is a simplified block diagram of a pipeline analog-to-digital converter (ADC) 100. As shown, the pipeline ADC 100 includes stages 102-1 through 102-N that receive and process an analog input signal 104. The pipeline ADC 100 generates a multi-bit digital representation of the received analog input signal 104. Each stage 102 contributes a few bits (e.g., one to three bits) to the overall multiple bit representation of the analog input signal 104 generated by the pipeline ADC 100. By concatenating the bits resolved by each stage 102, the overall multiple bit representation of the analog input signal 104 is formed. Each successive pipeline stage 102-1 through 102-N improves upon the level of resolution provided by a prior stage 102. For example, stage 102-1 can output n of the Most Significant Bits (MSBs) 106-1 that will be used to digitally represent the analog input signal 104. Accordingly, stage 102-2 can output the n of the next MSBs 106-2 while the final stage 102-N can output n of the Least Significant Bits (LSBs) 106-N that will be used to digitally represent the analog input signal 104.

Each of the first N−1 stages 102 includes a coarse quantizer and a residual generator. The coarse quantizer of a stage 102 outputs a digital representation of the received input signal at relatively low resolution 106—i.e., a representation of only a few bits. For example, the resolution of each stage 102 can be three bits of resolution. The residual generator of each stage 102 receives the output of the coarse quantizer and generates an error signal or residual signal that is passed to the next stage 102 for processing. The next stage 102 subsequently improves upon the representation of the analog input signal 104 generated by the immediately prior stage 102.

Figure 2:
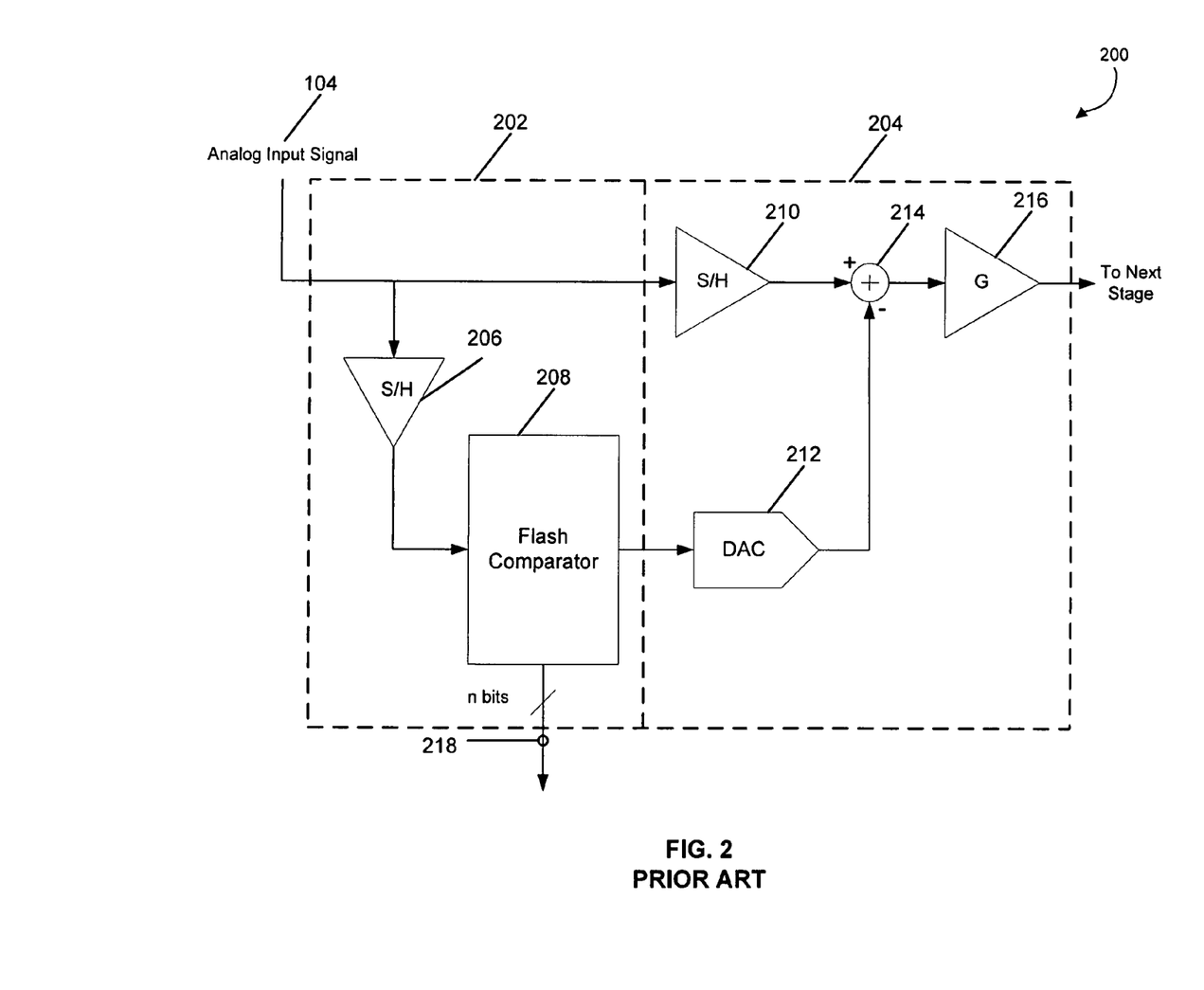
FIG. 2 is a simplified block diagram of a first prior art design of an ADC stage of a pipeline ADC.

FIG. 2 is a simplified block diagram of an ADC stage 200 of a pipeline ADC. The ADC stage 200 illustrated in FIG. 2 can be, for example, the first stage 102-1 depicted in FIG. 1. The ADC stage 200 can receive the analog input signal 104 and can be coupled to a next stage of the pipeline ADC 100—e.g., the ADC stage 200 can be connected to next ADC stage 102-2 depicted in FIG. 1.

The ADC stage 200 includes a coarse quantizer 202 and a residual generator 204. The coarse quantizer includes a sample-and-hold (S/H) circuit 206 and a flash comparator 208. The residual generator 204 includes an S/H circuit 210, a digital-to-analog converter (DAC) 212, a summer 214, and an amplifier 216. The residual generator 204 is often referred to as a multiplying DAC or MDAC.

The analog input signal 104 is a continuous time input signal. The S/H circuit 206 samples the analog input signal 104 and holds the signal at a DC value. The held value of the analog input signal 104 is then provided to the flash comparator 208. The flash comparator 208 operates on the held value of the analog input signal 104 and generates a digital representation 218 of the sampled analog input signal 104 as output (i.e., an n bit representation). The flash comparator 208 can include multiple comparators and can be viewed as a flash comparator bank.

The output generated by the flash comparator 208 is provided to the DAC 212. The DAC 212 generates an analog signal based on the digital representation provided by the flash comparator 208. In essence, the DAC 212 regenerates the held analog input signal 104 based on the digital representation 218 of the analog input signal 104 generated by the flash comparator 208.

The S/H circuit 210 operates similarly to the S/H circuit 206. Specifically, the S/H circuit samples the analog input signal 104 and holds the signal at a DC value. The held value of the sampled analog input signal 104 is then provided to the summer 214. The summer 214 compares the held value of the sampled analog input signal 104 output by the S/H circuit 210 to the output of the DAC 212. As a result of the comparison between the two signals, an error signal is generated and passed to the amplifier 216. The amplifier 216 has a gain, G, and amplifies the residual signal and provides it to a next pipeline stage for further processing.

The residual generator determines the difference between the sampled version of the analog input signal 104 (i.e., the output of the S/H circuit 210) and the analog signal represented digitally by the coarse quantizer 202. Because the coarse quantizer 202 generates a digital representation of the analog signal 104 at low resolution, the analog signal generated from the digital representation can differ from the held analog signal output by the S/H circuit 210. Accordingly, the difference between the two signals is considered to be a residual signal as it represents the difference between a true value of the held analog input signal 104 and a low resolution estimate of the held value of the analog input signal 104. This residual signal is amplified by the amplifier 216 and passed to a next stage to improve the resolution of the estimation of the analog input signal 104.

The design of the ADC stage 200 depicted in FIG. 2 can suffer from a number of problems. Perhaps most notably, the ADC stage 200 requires the S/H circuit 206 to sample the analog signal input 104 at exactly the same time as the S/H circuit 210. If the sampling of the analog input signal 104 does not occur at the same time, then a sampling error will occur. That is, the sampled and held version of the analog input signal 104 output by the S/H circuit 206 will not substantially match the sampled and held version of the analog input signal 104 output by the S/H circuit 210.

When a sampling error occurs, the residual signal provided to the next stage will represent an unnecessarily large difference between the two compared signals that can affect the overall accuracy of the resulting digital representation of the analog input signal 104. As the frequency of the input analog signal 104 increases, it becomes more difficult and challenging to ensure that the S/H circuit 206 and the S/H circuit 210 will sample the analog input signal 104 at precisely the same time. Accordingly, the design of the ADC stage 200 depicted in FIG. 2 may perform poorly for high frequency input signals.

Figure 3:
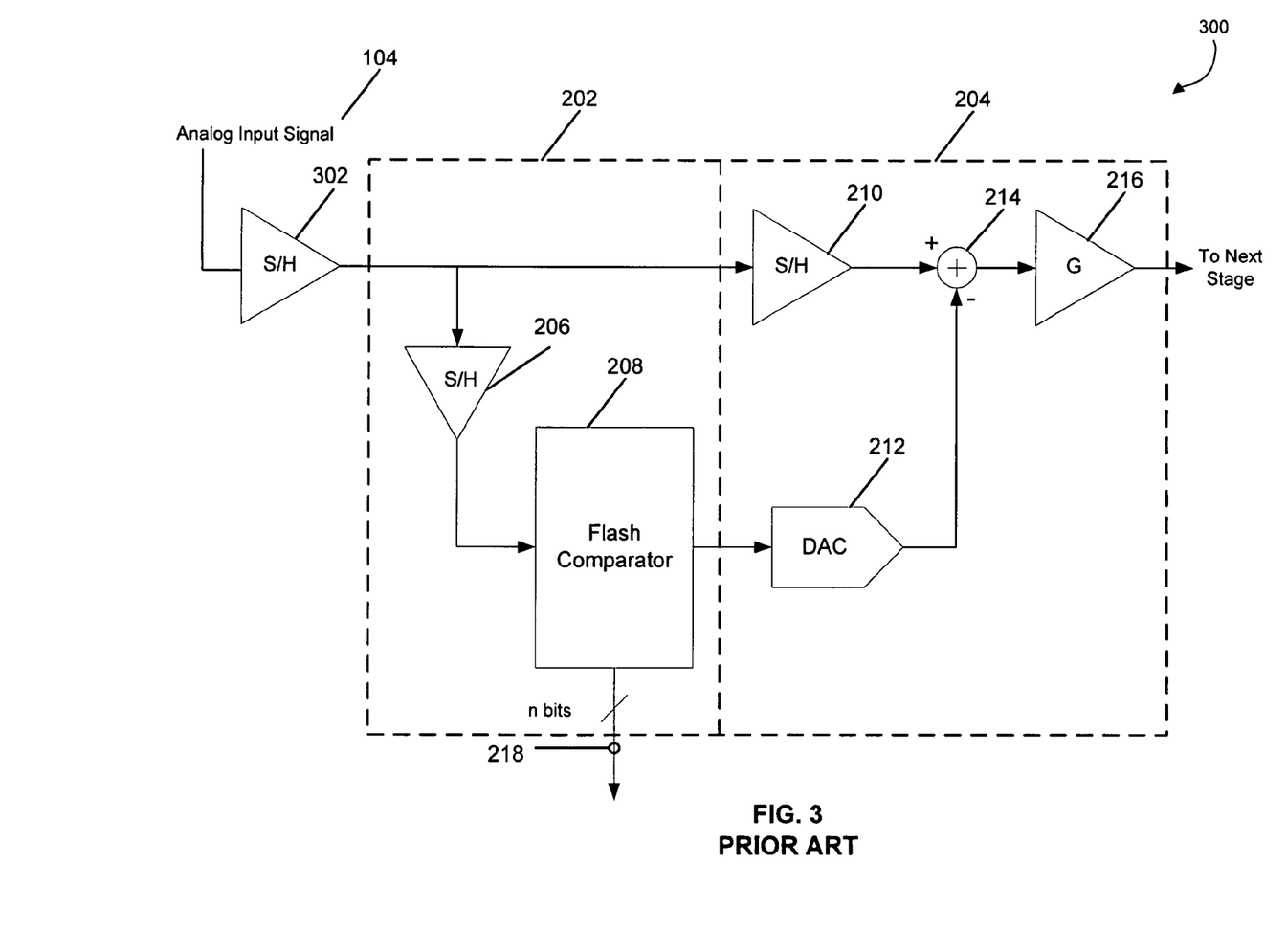
FIG. 3 is a simplified block diagram of a second prior art design of an ADC stage of a pipeline ADC.

FIG. 3 is a simplified block diagram of an ADC stage 300. The ADC stage 300 is a first stage ADC of a pipeline ADC. The ADC stage 300 resembles the ADC stage 200 but includes an S/H circuit 302. The S/H circuit 302 is coupled to the analog input signal 104. The output of the S/H circuit is provided to both the coarse quantizer 202 and the residual generator 204.

The S/H circuit 302 samples the analog input signal 104 and provides the same stable voltage value to the coarse quantizer 202 and residual generator 204. Because the same exact held value of the sampled analog input signal 104 is provided to both the coarse quantizer 202 and residual generator 204, the likelihood of a sampling error is reduced. As a result, the ADC stage 300 can typically handle higher frequency input signals when compared to the ADC stage 200.

The introduction of the S/H circuit 302, however, can have significant drawbacks. First, because the S/H circuit 302 is coupled to the front-end of the signal chain, the S/H circuit 302 is required to operate at the full resolution of an entire pipeline ADC to which it is coupled. Consequently, the performance requirements of the S/H circuit 302 are very stringent. Second, the linearity limitation of the S/H circuit 302 dictates the linearity of the overall pipeline ADC. Further, the S/H circuit 302 has high operational power requirements. Lastly, the S/H circuit 302 introduces a large amount of noise into the pipeline ADC. For at least these reasons, alternatives to the ADC stage 300 have been sought.

Figure 4:
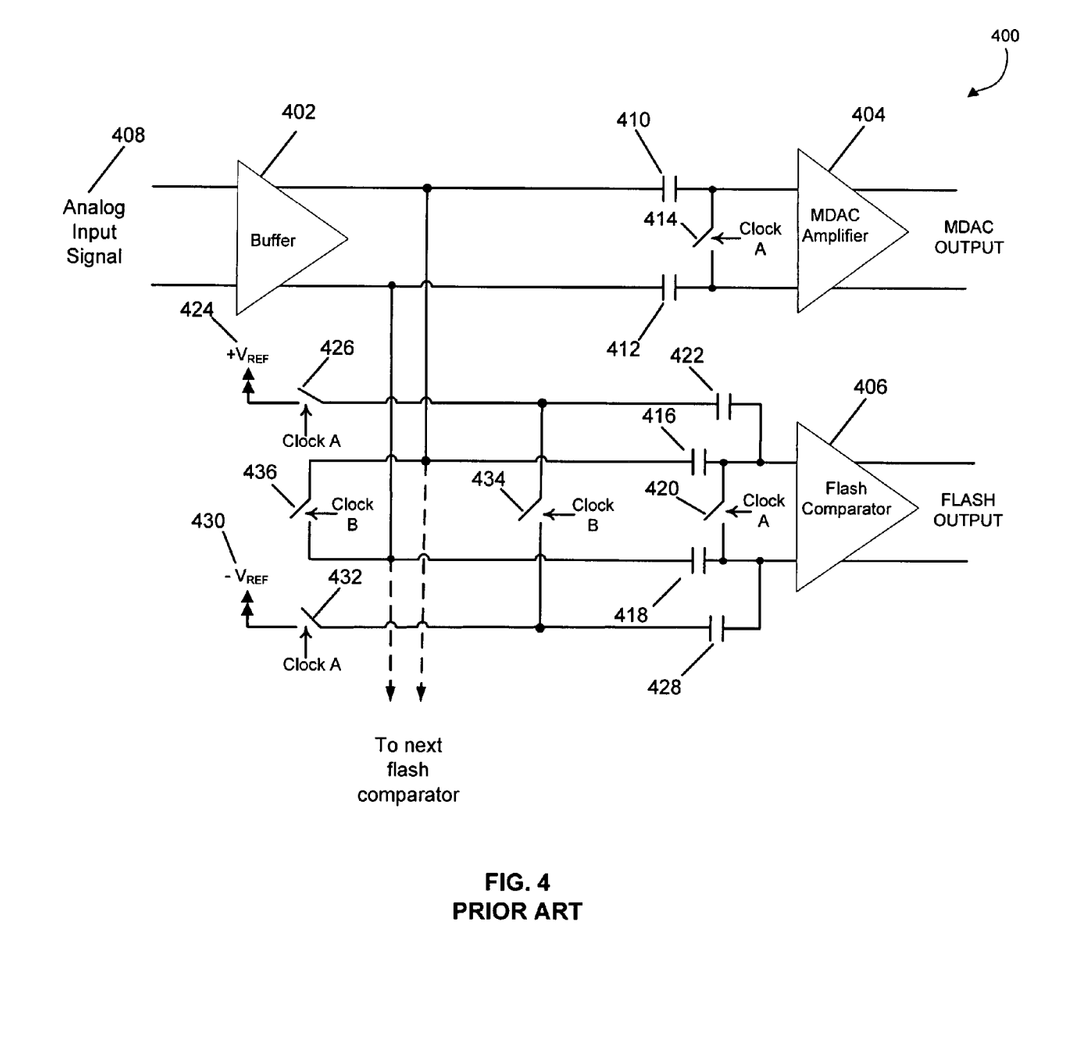
FIG. 4 is a simplified block diagram of a prior art design of a pipeline ADC stage that obviates the need for a front-end S/H circuit.

FIG. 4 is a simplified block diagram of a prior art design of a pipeline ADC stage 400 that obviates the need for a front-end S/H circuit. The ADC stage 400 is similar to the pipeline ADC stage disclosed in U.S. Pat. No. 6,396,429, hereby incorporated by reference in its entirety.

As shown, the ADC stage 400 includes an input buffer amplifier 402, an MDAC amplifier 404 and a flash comparator 406. Only a single flash comparator 406 is illustrated for simplicity. In practice, N flash comparators are coupled together in parallel where $\log_2 N$ represents the bit resolution of the ADC stage 400. A parallel connection to a next flash comparator is shown in phantom. The ADC stage 400 is shown as a differential ADC stage that receives and processes a differential analog input signal 408.

A capacitor 410 is coupled to a first differential input of the MDAC amplifier 404 and a capacitor 412 is coupled to a second differential input of the MDAC amplifier 404. The differential inputs of the MDAC amplifier are coupled together by a switch 414. Collectively, the first and second capacitors 410 and 412 together with the switch 414 can be viewed as the sampling structure or network for the MDAC amplifier 404.

The sampling structure of the flash comparator 406 mimics the sampling structure of the MDAC amplifier 404. Specifically, capacitor 416 is coupled to a first differential input to the flash comparator 406 and a capacitor 418 is coupled to a second differential input to the flash comparator 406. A switch 420 is coupled between the first and second inputs of the flash comparator 406.

A capacitor 422 is coupled to a reference voltage 424 by a switch 426. The capacitor 422 is also coupled to the first differential input of the flash comparator 406. A capacitor 428 is coupled to a reference voltage 430 by a switch 432. The capacitor 428 is also coupled to the second differential input of the flash comparator 406. A switch 434 is coupled to a first node between the capacitor 422 and the switch 426 and a second node between the capacitor 428 and the switch 432. A switch 436 is coupled between the capacitor 416 and the capacitor 418.

The switches 414, 420, 426 and 432 are controlled by a first clock A. The switches 434 and 436 are controlled by a second clock B. The clocks A and B are non-overlapping, complementary clock signals. Sampling structures that match the sampling structure coupled to the flash comparator 406 are coupled to each flash comparator included in the ADC stage 400. Specifically, the structure comprising switches 420, 434, 436, 426 and 432, capacitors 416, 418, 422 and 428 and reference voltages 424 and 430 is coupled to the input of each flash comparator of the ADC stage 400. Each flash comparator uses an identical sampling structure but for a change to the value of the reference voltages 424 and 430 necessary for voltage comparison operations of each flash comparator.

As previously mentioned, the sampling structure of the MDAC amplifier 404 is mimicked by the sampling structure of the flash comparator 406. The two sampling structures are designed to be matched to ensure that both the MDAC amplifier 404 and the flash comparator 406 sample the analog input signal 408 at substantially the same time. Specifically, during a first phase of the operation of the ADC stage 400, the switches controlled by clock A (switches 414, 420, 426 and 432) are closed and the switches controlled by clock B (434 and 436) are open. As a result, a sample of the analog input signal 408 is stored on the input capacitors 410 and 412 of the MDAC amplifier 404 and on the input capacitors 416 and 418 of the flash comparator 406. The reference voltages 424 and 430 are also stored on the outer input capacitors 422 and 428, respectively, of the flash comparator 406.

By matching the capacitors 410 and 412 to the capacitors 416 and 418 and by controlling the charge stored on each of the capacitors using the same clock signal, the ADC stage 400 can better ensure that the sample of the analog input signal 408 provided to the MDAC amplifier 404 will substantially match the sample of the analog input signal 408 provided to the flash comparator 406.

Once the sample of the analog input signal 408 is stored on the inner capacitors 416 and 418 of the flash comparator, the sample value is transferred to the flash comparator 406 during a second phase of the operation of the ADC stage 400. Specifically, during the second phase, the switches controlled by clock B (switches 434 and 436) are closed and the switches controlled by clock A (switches 414, 420, 426 and 432) are open. As a result, a scaled version of the sample voltages stored on the input capacitors 416 and 418 of the flash comparator 406 are provided to the internal circuit components comprising the flash comparator 406. In effect, the charges stored on the input capacitors 416 and 418 are transferred to the flash comparator 406 for processing. At the same time, the sample voltages stored on the input capacitors 410 and 412 of the MDAC amplifier are provided to the internal circuit components comprising the MDAC amplifier 404.

Sampling errors are mitigated during operation of the ADC stage 400 by requiring the sampling network of the flash comparator 406 to substantially match the sampling network of the MDAC amplifier 404. Specifically, the signal paths and components used to sample the analog input signal 408 at the inputs of the flash comparator 406 and the MDAC amplifier 404 are identical.

The matched sampling networks of the flash comparator 406 and the MDAC amplifier 404 introduces some operational penalties. For example, by the end of the second phase of operation, a number of operations must occur internally within the flash comparator 406 to accommodate the next sampling cycle which begins when the switches controlled clock A are closed. Specifically, during the second phase (or within half a clock cycle of clock B):

1. The charge stored on the inner capacitors 416 and 418 and outer input capacitors 422 and 428 of the flash comparator 406 must be transferred to the internal circuitry of the flash comparator 406.

2. After these inputs are provided to the flash comparator 406, the flash comparator 406 must latch to/process these inputs and output a decision.

3. The output of the flash comparator 406 must then be provided to the MDAC amplifier 404 for generation of the residual signal.

4. The MDAC amplifier 404 must use the output of the flash comparator 404 to generate and amplify a residual signal and provide this error signal to the next ADC stage.

Step 1—transferring the charges stored on inner capacitors 416 and 418 and outer capacitors 422 and 428 of the flash comparator 406—can introduce a significant delay in the above design. The delay for transferring this charge can be approximately 300 to 400 ps. For lower sampling rates of 125 Msamples/s, this delay is tolerable. For higher sampling rates (e.g., 500 Msamples/s), the delay cannot be accommodated as it provides too little time for the MDAC amplifier 404 to receive and operate on the output of the flash comparator 406 before the beginning of a next sampling cycle. Specifically, it strains the operational capabilities of the MDAC amplifier 404 by requiring it to generate and amplify a residual signal in less than 700 ns, approximately. This requirement may be difficult to meet without significant changes to the design and power requirements of the MDAC amplifier 404. Therefore, a design for a front-end ADC stage is needed that accommodates high frequency input signals (and therefore high sampling frequencies) without the penalties introduced by the matched sampling network design of the ADC stage 400.

Figure 5:
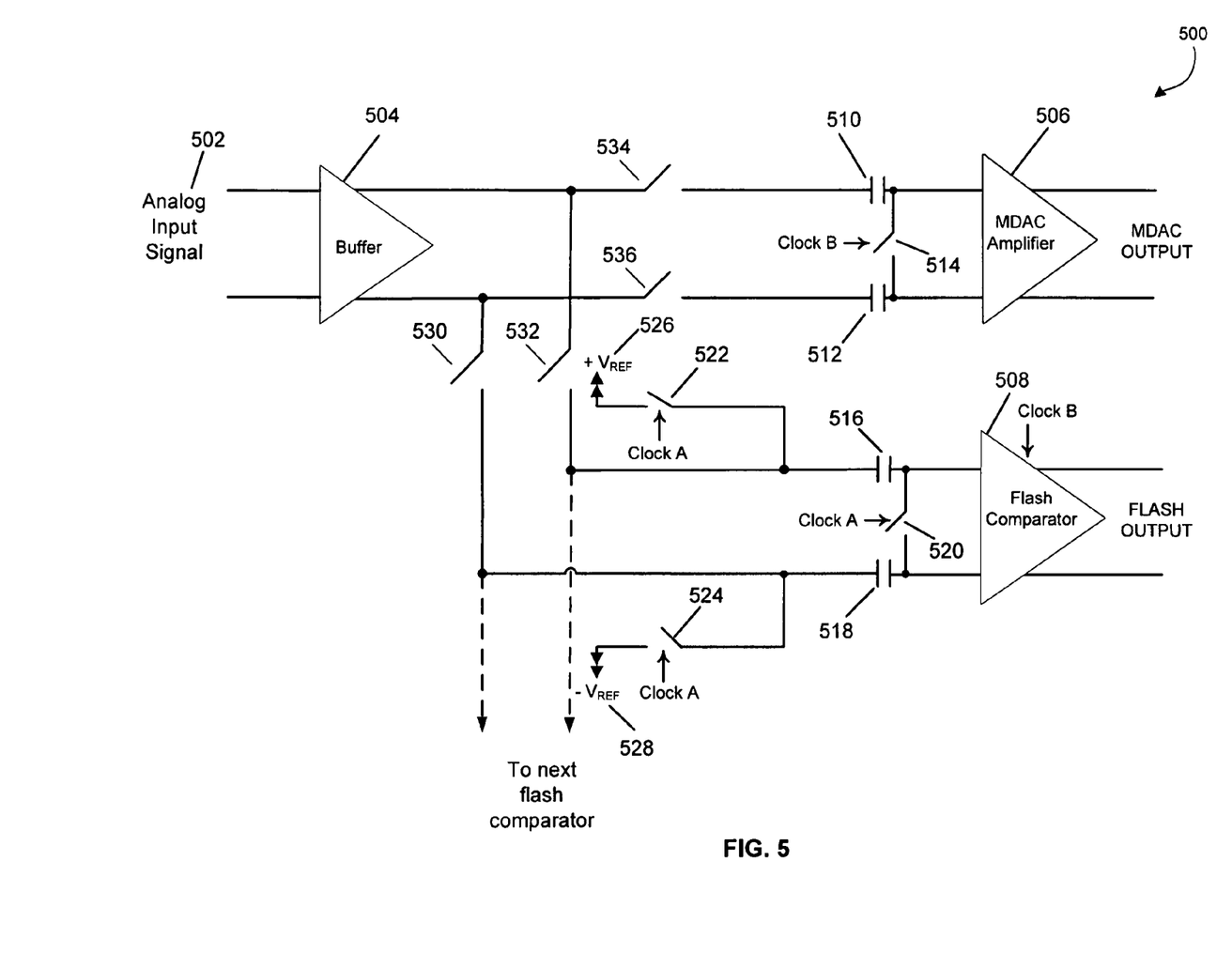
FIG. 5 illustrates a simplified block diagram of an improved S/H-less ADC stage design according to an aspect of the present invention.

FIG. 5 illustrates a simplified block diagram of an improved S/H-less ADC stage 500 design according to an aspect of the present invention. As shown, the ADC stage 500 may include an input buffer amplifier 504, an MDAC amplifier 506 and a flash comparator 508. Only a single flash comparator 508 is illustrated for simplicity. In practice, N flash comparators are coupled together in parallel where $\log_2 N$ represents the bit resolution of the ADC stage 500. A parallel connection to a next flash comparator is shown in phantom. The ADC stage 500 is shown as a differential ADC stage that receives and processes a differential analog input signal 502.

A capacitor 510 is coupled to a first differential input of the MDAC amplifier 506 and a capacitor 512 is coupled to a second differential input of the MDAC amplifier 506. The differential inputs of the MDAC amplifier 506 are coupled together by a switch 514. The capacitor 510 is coupled to a first component of the analog input signal 502. The capacitor 512 is coupled to a second component of the analog input signal 502. The input buffer 504 can be turned on and off to couple the analog input signal 502 to the MDAC 506 and the flash comparator 508. Alternatively, switches can be used to coupled and decouple the MDAC 506 and the flash comparator 508 to the analog input signal. Collectively, the first and second capacitors 510 and 512 together with the switch 514 can be viewed as the sampling structure for the MDAC amplifier 506.

A capacitor 516 is coupled to a first differential input to the flash comparator 508 and a capacitor 518 is coupled to a second differential input to the flash comparator 508. A switch 520 is coupled between the first and second inputs of the flash comparator 508.

The capacitor 516 is coupled to a reference voltage 526 by a switch 522. The capacitor 518 is coupled to a reference voltage 528 by a switch 524. The capacitor 516 is also coupled to a first component of the analog input signal 502. Similarly, the capacitor 518 is coupled to a second component of the analog input signal 502.

The switches 520, 522 and 524 are controlled by a first clock A. The switch 514 is controlled by a second clock B. The operation of the flash comparator 508 is also controlled by the second clock B. Specifically, the clock B determines when the flash comparator latches to an input and produces an output or decision. The clocks A and B are non-overlapping clocks.

The ADC stage 500 may operate according to first phase (an initial or precharge phase) and a second phase (an acquisition phase). The initial phase corresponds to half a clock cycle of clock A—i.e., a time period when clock A activates switches 520, 522 and 524. The acquisition phase may correspond to half a clock cycle of clock B—i.e., a time period when clock B activates switch 514. Together, the first and second phases of operation can be viewed as corresponding to one full clock cycle of either clock A or B.

During the first phase of the operation of the ADC stage 500, the switches controlled by clock A (switches 520, 522 and 524) may close and the switch controlled by clock B (switch 514) may open. As a result, the reference voltages 526 and 528 charge the input capacitors 516 and 518, respectively, of the flash comparator 508. The buffer 504 does not drive the MDAC 506 or the flash comparator 508 during the precharge phase. That is, the analog input signal 502 is not coupled to the inputs of the MDAC 506 or the flash comparator 508 during the precharge phase either by switching the buffer 504 off or using one or more switches to decouple the analog input signal 502 from the signal path. For example, switches can be placed in the signal path between the buffer 504 and the MDAC 506 and the signal path between the buffer 504 and the flash comparator 508 to couple/decouple the analog input signal 502 to the components of the ADC stage 500.

During the acquisition phase, the switch controlled by clock B may close (switch 514) and the switches controlled by clock A may open (switches 520, 522 and 524). Consequently, a scaled version of the analog input signal 502 is provided to the input capacitors 516 and 518 of the flash comparator 508. Specifically, because the input capacitors 516 and 518 are pre-charged to appropriate reference offset voltages 526 and 528, respectively, a scaled version of the analog input signal 502, as continuous time signal, is provided to the regeneration nodes of the flash comparator 508.

In essence, the first differential component of the analog input signal 502, scaled by the voltage stored on the capacitor 516, is provided to the first differential input of the flash comparator 508. Likewise, a second differential component of the analog input signal 502, scaled by the voltage stored on the capacitor 518, is provided to the second differential input of the flash comparator 508.

In contrast to the ADC stage 400 depicted in FIG. 4, the ADC stage 500 provides a scaled version of the analog input signal 502 as a continuous time signal to the flash comparator 508. The scaled continuous time signal propagates to the input of the flash comparator 508 much more quickly than a DC charge, thereby reducing the response time of the flash comparator 508.

More specifically, no delay is introduced that is caused by the transfer of a DC charge as was necessary in the ADC stage 400. Instead, in the ADC stage 500, at the beginning of the second stage of operation, the clock B can latch the input of the flash comparator 508 and produce an output or decision at substantially the same time as the start of the acquisition phase. As a result, the output of the flash comparator 508 is provided to the residual generator of the ADC stage 500 more quickly than with the ADC stage 400. This affords the MDAC amplifier 506 more time to receive and operate on the output of the flash comparator 508. In turn, higher frequency analog input signals 502 can be sampled and processed by the ADC stage 500 relative to the input signals the ADC stage 400 is capable of processing.

Also during the acquisition phase, the MDAC 506 is coupled to the analog input signal 502. Specifically, a first component of the analog input signal 502 charges the capacitor 510 while a second component of the analog input signal 502 charges the capacitor 512. The stored charges are then transferred to the MDAC 506 for the MDAC 506 to operate on the stored values. That is, the MDAC 506 uses the stored charges in conjunction with the output of the flash comparator 508 to generate a residual signal to a next stage ADC.

To accommodate very high frequency analog input signals 502, the ADC stage 500 can be designed to include an MDAC amplifier 506 and flash comparator 508 that have a very high response bandwidth and consequently very low time constant or response time. In particular, the bandwidth of the MDAC amplifier 506 and the bandwidth of the flash comparator 508 can each be made large enough to make sample timing mismatches between each component to be negligible. For example, the flash comparator 508 can have a bandwidth that tracks the bandwidth of the residual generator to a first order approximation. Accordingly, with the residual generator and flash comparator 508 having large input bandwidths, the variations in the delays introduced by the sampling networks of the MDAC 506 and the flash comparator 508 are very small and consequently introduce negligible sampling error.

The ADC stage 500 can be used as any stage in a pipeline ADC. Further, the ADC stage 500 can include as many parallel flash comparator 508 units as necessary to provide a desired bit resolution. The switches of the ADC stage 500 can be implemented as transistors. For example, the switches shown in FIG. 5 can be implemented using n-type metal-oxide semiconductor transistors (NMOS transistor) or p-type metal-oxide semiconductor transistors (PMOS transistor). Additionally, the ADC stage 500 is illustrated as accommodating differential analog input signals but can be implemented to handle single-ended analog input signals as would be appreciated by one having ordinary skill in the relevant art.

By precharging the input capacitors of the flash comparator 508, the ADC stage 500 enables a high frequency continuous time signal, scaled by the appropriate reference voltage, to be applied to the flash comparator 508. Because a high frequency continuous time signal is applied to the flash comparator 508, the flash comparator 508 can receive and operate on the input to produce an output more quickly than if a DC charge from a capacitor had to be transferred to the flash comparator 508 as in the design of the ADC stage 400. The flash comparator 508 of the ADC stage 500 can be designed to have a high analog bandwidth that accommodates the propagation of the analog input signal. As a result, the delay caused by waiting for a DC charge to propagate through the flash comparator 508 is removed. This allows the MDAC 506 to receive the output of the flash comparator 508 more quickly and therefore affords the MDAC 506 more time to process the flash comparator 508 output and to generate and amplify its own output. In turn, higher frequency analog input signal and therefore higher sampling rates can be accommodated with the design of the ADC stage 500.

Figure 6:
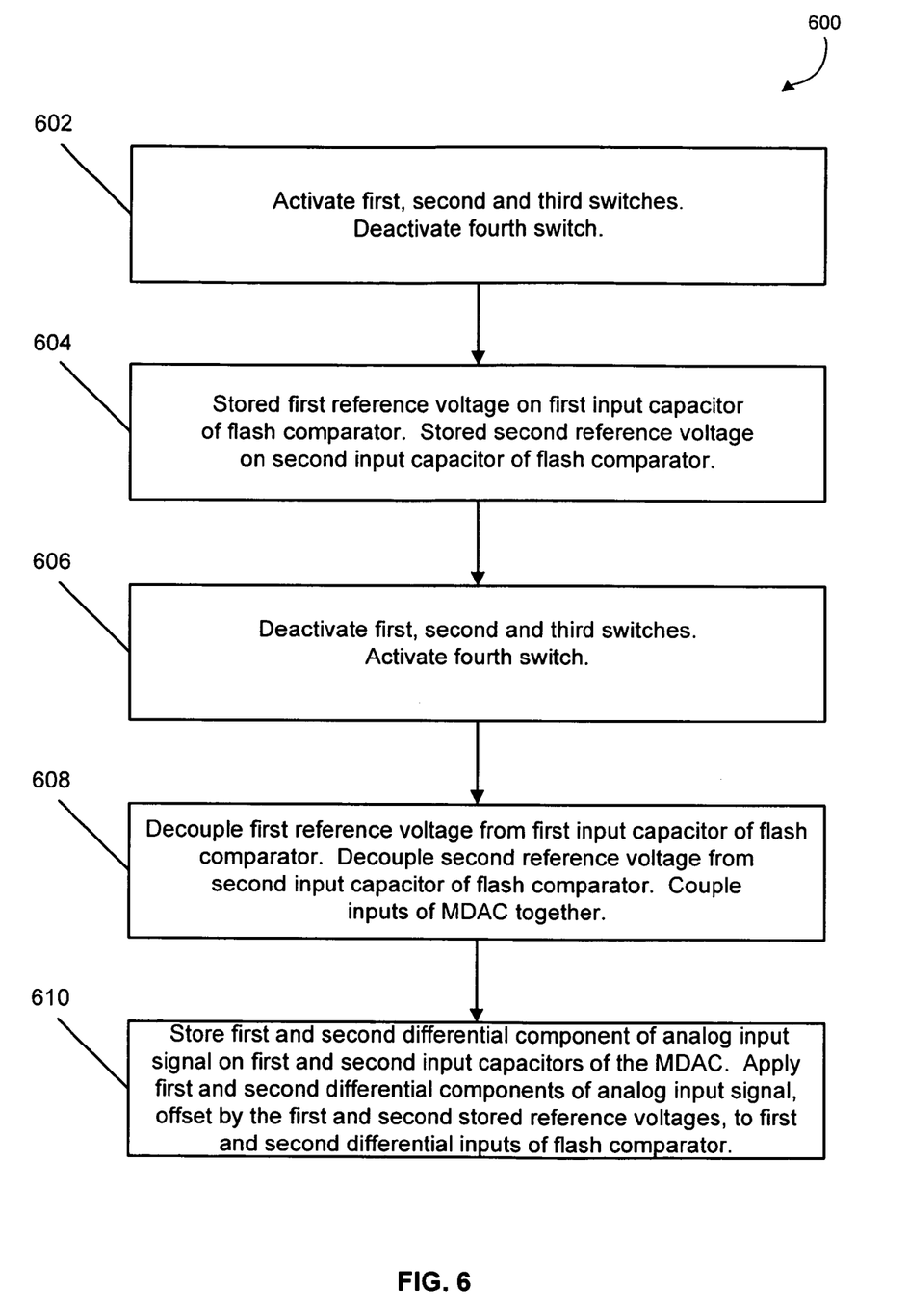
FIG. 6 provides a flowchart illustrating a method for receiving and processing an analog input signal in a first stage of an ADC pipeline in accordance with an aspect of the present invention.

FIG. 6 provides a flowchart illustrating a method 600 for receiving and processing an analog input signal in a first stage of an ADC pipeline in accordance with an aspect of the present invention. The method 600 can be implemented using, for example, the ADC stage 500 depicted in FIG. 5.

At step 602, a first clock activates a first switch coupled to the differential inputs of a flash comparator. The first clock also activates a second switch coupled between a first reference voltage and a first differential input of the flash comparator. Lastly, a third switch coupled between a second reference voltage and a second differential input of the flash comparator is activated. At step 602, a second clock deactivates a fourth switch coupled between the differential inputs of an MDAC.

At step 604, the activation of the first, second and third switches causes the first reference voltage to be stored on a first input capacitor of the flash comparator. The activation of the first, second and third switches also causes the second reference voltage to be stored on a second input capacitor of the flash comparator.

Steps 602 and 604 can be considered to the pre-charge phase of operations for the method 600.

At step 606, the first clock deactivates the first, second and third switches. Also at step 606, the second clock activates the fourth switch coupled to the differential inputs of the MDAC.

At step 608, the deactivated first switch decouples the first differential input of the flash comparator from the second differential input of the flash comparator. The deactivated second switch decouples the first reference voltage from the first input capacitor of the flash comparator. Further, the deactivated third switch decouples the second reference voltage from the second input capacitor. The fourth switch, as mentioned above, couples the first differential input of the MDAC to the second differential input of the MDAC and also couples a first input capacitor of the MDAC to a second input capacitor of the MDAC.

At step 610, a continuous time analog input signal is applied to the input of the flash comparator and to the input of the MDAC. As a result of the fourth switch being activated, a first differential component of the analog input signal is stored on the first input capacitor of the MDAC while a second differential component of the analog input signal is stored on the second input capacitor of the MDAC. The continuous time analog input signal is applied to the inputs of the flash comparator after being scaled by the stored reference voltages stored on the first and second capacitors of the flash comparator. Specifically, the first differential component of the analog input signal, offset by the first stored reference voltage, is applied to the first differential input of the flash comparator. Similarly, the second differential component of the analog input signal, offset by the second stored reference voltage, is applied to the second differential input of the flash comparator.

The second clock can be used to latch the output of the flash comparator based on the input applied to the flash comparator. That is, the flash comparator can be triggered to operate on the differential analog input signal applied to the flash comparator to output a decision that can be passed to the MDAC for further processing.

The method 600 described above be expanded to cover the interaction between one or more flash comparators and the MDAC. Further, one or more steps of the method 600 can be implemented at the same time or substantially the same time. Steps 602 and 604 can occur during a first portion of a repeatable sample cycle while steps 606, 608 and 610 can occur during a second portion of a repeatable sample cycle. Specifically, the first half of the sample cycle can be aligned with the first half of the first clock cycle while the second half of the sample cycle can be aligned with the second half of the second clock cycle, with the first and second clocks being non-overlapping, complementary clocks. At the end of step 610, a next sample cycle can begin—i.e., the method 600 can cyclically step through steps 602 through 610 to effectuate the sampling and processing of multiple samples of an analog input signal.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. In a pipeline analog-to-digital converter (ADC), a front-end ADC stage comprising:
   a multiplying digital-to-analog converter (MDAC), the MDAC comprising:
   a first differential input;
   a second differential input;
   a first switch coupled between the first and second differential inputs;
   a first input capacitor coupled to the first switch and a first differential component of an analog input signal; and
   a second input capacitor coupled to the first switch and a second differential component of the analog input signal; and
   a flash comparator, the flash comparator comprising:
   a third differential input;
   a fourth differential input;
   a second switch coupled between the third and fourth differential inputs;
   a third input capacitor coupled to the second switch and the first differential component of the analog input signal;
   a fourth input capacitor coupled to the second switch and the second differential component of the analog input signal;
   a third switch coupled to a first reference voltage and the third input capacitor; and
   a fourth switch coupled to a second reference voltage and the fourth input capacitor, wherein an output of the flash comparator is coupled to the MDAC.

2. The front-end ADC stage of claim 1, wherein a first clock signal controls the second, third and fourth switches and a second clock signal controls the first switch.

3. The front-end ADC stage of claim 2, wherein the first and second clock signals are non-overlapping, complementary clocks.

4. The front-end ADC stage of claim 2, wherein the second clock signal controls a latch of the flash comparator.

5. The front-end ADC stage of claim 1, wherein a bandwidth of the flash comparator tracks a bandwidth of the MDAC to a first order approximation.

6. The front-end ADC stage of claim 1, wherein the analog input signal is sampled as a continuous time signal at regeneration nodes inside the flash comparator.

7. The front-end ADC stage of claim 1, wherein:
   the first switch is open during a first half cycle of the second clock signal and is closed during a second half cycle of the second clock signal; and
   the second, third and fourth switches are closed during a first half cycle of the first clock signal and are open during a second half cycle of the first clock signal.

8. The front-end ADC stage of claim 7, wherein the first reference voltage is stored on the third input capacitor and the second reference voltage is stored on the fourth input capacitor during the first half cycle of the first clock signal.

9. The front-end ADC stage of claim 8, wherein a scaled version of the first component of the analog input signal is applied to the third differential input and a scaled version of the second component of the analog input signal is applied to the fourth differential input during the second half clock cycle of the second clock signal.

10. The front-end ADC stage of claim 9, wherein the scaled versions of the first and second components of the analog input signal are sampled at regeneration nodes of the flash comparator during the second half clock cycle of the second clock signal.

11. The front-end ADC stage of claim 10, wherein the scaled versions of the first and second components of the analog input signal are each continuous time signals.

12. In a pipeline analog-to-digital converter (ADC), a method for sampling an analog input signal within a front-end ADC stage, comprising:
  during a first phase:
    activating a first switch coupled between a first differential input and a second differential input of a flash comparator;
    activating a second switch coupled between a first reference voltage and the first differential input of the flash comparator to charge a first input capacitor coupled between the second switch and the first differential input of the flash comparator to the first reference voltage; and
    activating a third switch coupled between a second reference voltage and the second differential input of the flash comparator to charge a second input capacitor coupled between the third switch and the second differential input of the flash comparator to the second reference voltage;
  during a second phase:
    deactivating the first, second and third switches;
    activating a fourth switch coupled between a first differential input and a second differential input of a multiplying digital-to-analog converter (MDAC); and
    providing a differential analog input signal as a continuous time signal to the differential inputs of the flash comparator.

13. The method of claim 12, further comprising, during the second phase, latching the flash comparator to sample the differential analog input signal at regeneration nodes inside the flash comparator.

14. The method of claim 12, wherein activating the fourth switch further comprises sampling a first component of the differential analog input signal on a first input capacitor of the MDAC and sampling a second component of the differential analog input signal on a second input capacitor of the MDAC.

15. The method of claim 12, further comprising, during the second phase, generating a flash comparator output and providing the flash comparator output to the MDAC.

16. In a pipeline analog-to-digital converter (ADC), a method for sampling an analog input signal within a front-end ADC stage, comprising precharging reference capacitors of a flash comparator during a first phase;
  sampling a differential analog input signal using a sampling network coupled to a differential input of a multiplying digital-to-analog converter (MDAC) during a second phase; and
  sampling the differential analog input signal as a continuous time signal at regeneration nodes inside the flash comparator during the second phase.

17. The method of claim 16, wherein precharging comprises:
  coupling a first reference capacitor of the flash comparator to a first reference voltage; and
  coupling a second reference capacitor of the flash comparator to a second reference voltage.

18. The method of claim 17, wherein sampling the differential analog input signal as a continuous time signal comprises:
  providing a first component of the differential analog input signal, scaled by the first reference voltage, to regeneration nodes inside the flash comparator; and
  providing a second component of the differential analog input signal, scaled by the second reference voltage, to regeneration nodes inside the flash comparator.

19. In a pipelined analog-to-digital converter (ADC), a front-end ADC stage comprising:
  an MDAC having a first differential input and a second differential input;
  a first pair of sampling capacitors, a first sampling capacitor coupled to the first differential input and a second sampling capacitor coupled to a second differential input;
  a flash comparator having a third differential input and a fourth differential input;
  a second pair of sampling capacitors, a third sampling capacitor coupled to the third differential input and a fourth sampling capacitor coupled to the fourth differential input;
  first switch control, alternatively coupling the third sampling capacitor between a first reference voltage and a first component of a differential analog input signal and alternatively coupling the fourth sampling capacitor between a second reference voltage and a second component of the differential analog input signal; and
  second switch control, alternatively coupling and decoupling the first and second sampling capacitors to the differential analog input signal,
  wherein:
    the first pair of sampling capacitors are decoupled from the differential analog input signal when the second pair of sampling capacitors are coupled to the first and second reference voltages; and
    the first pair of sampling capacitors are coupled to the differential analog input signal when the second pair of sampling capacitors are coupled to the differential analog input signal.

* * * * *